United States Patent
Tseng et al.

(10) Patent No.: US 7,499,693 B2
(45) Date of Patent: Mar. 3, 2009

(54) MIXER FOR HOMODYNE RF RECEIVER

(75) Inventors: Ying-Che Tseng, Taipei Hsien (TW); Nean-Chu Cheng, Taipei Hsien (TW)

(73) Assignee: Via Technologies, Inc., Hsin Tien, Taipei Hsien (TW)

( * ) Notice: Subject to any disclaimer, the term of this patent is extended or adjusted under 35 U.S.C. 154(b) by 538 days.

(21) Appl. No.: 11/314,001

(22) Filed: Dec. 22, 2005

(65) Prior Publication Data

US 2007/0037545 A1 Feb. 15, 2007

(30) Foreign Application Priority Data

Aug. 12, 2005 (TW) .............................. 94127633 A

(51) Int. Cl.
*H04B 1/26* (2006.01)
*H04B 15/00* (2006.01)

(52) U.S. Cl. ..................... 455/324; 455/323; 455/313

(58) Field of Classification Search ................. 455/324, 455/307, 310, 312, 313, 323, 333, 334
See application file for complete search history.

(56) References Cited

U.S. PATENT DOCUMENTS

| | | | | |
|---|---|---|---|---|
| 5,530,929 A | * | 6/1996 | Lindqvist et al. ............ | 455/324 |
| 5,715,530 A | * | 2/1998 | Eul ............................. | 455/306 |
| 5,850,598 A | * | 12/1998 | Behrent ...................... | 455/324 |
| 6,192,225 B1 | * | 2/2001 | Arpaia et al. ............. | 455/196.1 |
| 6,807,406 B1 | * | 10/2004 | Razavi et al. ............... | 455/313 |
| 7,050,778 B1 | * | 5/2006 | Olson ......................... | 455/296 |
| 7,120,414 B2 | * | 10/2006 | Kim et al. ................... | 455/313 |
| 7,199,713 B2 | * | 4/2007 | Barink et al. ............ | 340/572.1 |
| 7,254,379 B2 | * | 8/2007 | Xu et al. ..................... | 455/296 |
| 2006/0178120 A1 | * | 8/2006 | Puma ..................... | 455/114.3 |

* cited by examiner

*Primary Examiner*—Sonny Trinh
(74) *Attorney, Agent, or Firm*—Birch, Stewart, Kolasch & Birch, LLP

(57) ABSTRACT

A mixer of a homodyne RF receiver made from a CMOS process is provided. The mixer comprises a gain stage, a switch stage and a load stage. The gain stage receives a differential-typed RF signal and generating a first gained signal. The switch stage mixes the first gained signal and a LO signal to direct down-convert into a modulated signal. The load stage comprises a first transistor, an impedance element and a second transistor. The first transistor provides a low impedance to permit the modulated signal entering the load stage. The second transistor provides a high impedance to resist signals. The load stage converts the modulated signal to a second gained signal according to a first gain coefficient of the impedance element. The first transistor is a parallel pnp BJT, and the second transistor is a vertical npn bipolar BJT.

11 Claims, 6 Drawing Sheets

US 7,499,693 B2

MIXER FOR HOMODYNE RF RECEIVER

BACKGROUND OF THE INVENTION (1) Field of the Invention

The present invention generally relates to a direct conversion radio frequency (RF) receiver, or a homodyne RF receiver, and particularly relates to a mixer for the homodyne RF receiver.

(2) Description of the Prior Art

Traditional Radio Frequency (RF) products usually employ a heterodyne RF receiver to receiving RF signal. In conventional wireless communication products, receivers usually utilize heterodyne technique, which is remarkable for its performance. Other kinds of receivers, such as the direct conversion RF receiver, the wideband IF receiver or the low IF receiver may be referred to deformed techniques of the heterodyne RF receiver.

The heterodyne RF receiver requires not only costly discrete devices but also application of external signal conversion. Heterodyne receivers convert RF signals from all channels into intermediate frequency (IF) signals by means of an external signal filter, and apply the IF signals to a local OSC and an external Voltage Control Oscillator (VCO) for conversion to base band signals, raising costs and limiting yield.

Therefore, direct conversion techniques, with lower power consumption and better suitability for multimedia systems, are widely used in receivers, omitting the need for IF signals conversion. The direct conversion RF receiver, also called a homodyne RF receiver, has another advantage of the system on a chip (SoC) application. The homodyne RF receiver can be regarded as a simplified heterodyne RF receiver, which has a zero intermediate frequency. So it also called a Zero IF receiver.

Please refer to FIG. 1. It shows a functional block diagram according to typical homodyne RF receiver. A typical homodyne RF receiver 10 at least comprises a LNA 14, a mixer (16a or 16b), a baseband amplifier (22a or 22b), a low pass filter (23a or 23b), an analog/digital convertor 24 and a DSP 26. The homodyne RF receiver 10 can be separated into a I channel and a Q channel. The mixer 16a, the baseband amplifier 22a, the low pass filter 23a and the ADC 24a are belonging to the I channel. The other set of the same elements (16b, 22b, 23b and 24b) is belonging to the Q channel.

In some prior arts, there could be a pre-selection filter 12 before the LNA 14 to filter signal from the antenna, here, predetermined out-of-band signals would be filtered out. Sometimes, the pre-selection filter 12 also has the function of eliminating the image frequencies. The output point of the pre-selection filter 12 is coupled with the LNA 14. For example, according to the specification of IEEE 802.11b, the received RF signal, the pre-selection filter 12 and the LNA 14 are all operated in a frequency between 2.4 GHz to 2.48 GHz. The output point of LNA 14 is coupled with the mixers 16a and 16b, individually. A local oscillator 18 provides LO signals. A frequency divider 15 generates phase difference of the LO signal for the I channel and the Q channel. Take the wireless specification of IEEE 802.11b for example, the local oscillator 18 is operated under a frequency of 2.4 GHz, to convert the signal to a low frequency signal nearby DC level.

Since the homodyne RF receiver direct down-converts the signal to nearby DC, performance of the mixer (16a or 16b) is more sensitive to LO self-mixing and low frequency performance. In the mixer (16a or 16b), as the desired signal converts to nearby DC, a folding load stage is implemented to adjust DC level for subsequent stage (i.e. the baseband amplifier 22a, the low pass filter 23a and the ADC 24a . . . etc.). Mentioned folding load stage is implemented after the gain stage and the switch stage of the mixer. However, it places additional challenges to IIP3 (third order input intercept point) performance and noise figure performance.

SUMMARY OF THE INVENTION

Under the tendency of system on a chip (SoC), therefore an objective of the present invention is to provide a mixer for homodyne RF receiver without forgoing drawbacks.

Another objective of the present invention is to provide a mixer for homodyne RF receiver, which has reduced noise figure.

Another objective of the present invention is to provide a mixer for homodyne RF receiver, which has improved IIP3 performance.

A mixer of a homodyne RF receiver made from a CMOS process is provided. The mixer comprises a gain stage, a switch stage and a load stage. The gain stage receives a differential-typed RF signal and generating a first gained signal. The switch stage mixes the first gained signal and a LO signal to direct down-convert into a modulated signal. The load stage comprises a first transistor pair, an impedance element and a second transistor pair. The first transistor pair provides a low impedance to permit the modulated signal entering the load stage. The second transistor pair provides a high impedance to resist signals. The load stage converts the modulated signal to a second gained signal according to a first gain coefficient of the impedance element.

In one embodiment, the first transistor pair can be implemented by parallel pnp BJTs, which are parasitically formed on a MOS structure. This parallel pnp BJT is capable of improving IIP3 performance. In one embodiment, the second transistor pair may be implemented by vertical npn BJTs, which are also formed on a MOS structure. This vertical npn BJT is capable of reducing total output noise of the homodyne RF receiver.

These and other objectives of the present invention will no doubt become understandable to those of ordinary skill in the art after reading the following detailed description of the preferred embodiment which is illustrated in the various figures and drawings

BRIEF DESCRIPTION OF THE DRAWINGS

The present invention will now be specified with reference to its preferred embodiment illustrated in the drawings, in which.

DESCRIPTION OF THE PREFERRED EMBODIMENT

The present invention provides a mixer for a homodyne RF receiver, which is able to be made from a complimentary metal-oxide semiconductor (CMOS) process. The provided mixer comprises a gain stage, a switch stage and a load stage.

Figure 1:
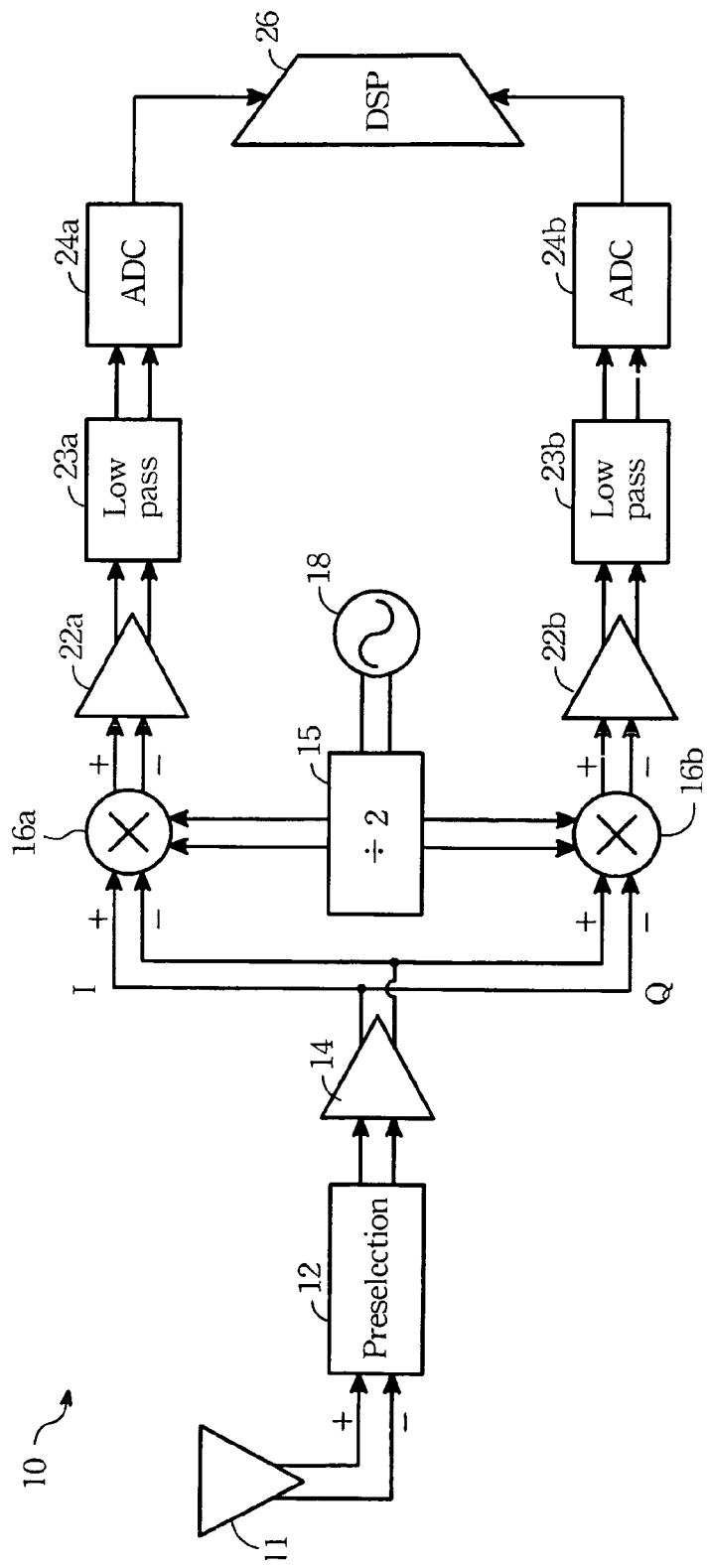
FIG. 1 shows a functional block diagram according to typical homodyne RF receiver.

According to related prior arts, the present invention generally relates to the mixer 16a (or 16b) shown in FIG. 1. What is deserved to be mentioned is that although the implemented circuit of some typical LNA 14 is similar with the gain stage of the present invention, however, they belong to separated issues.

Figure 2:
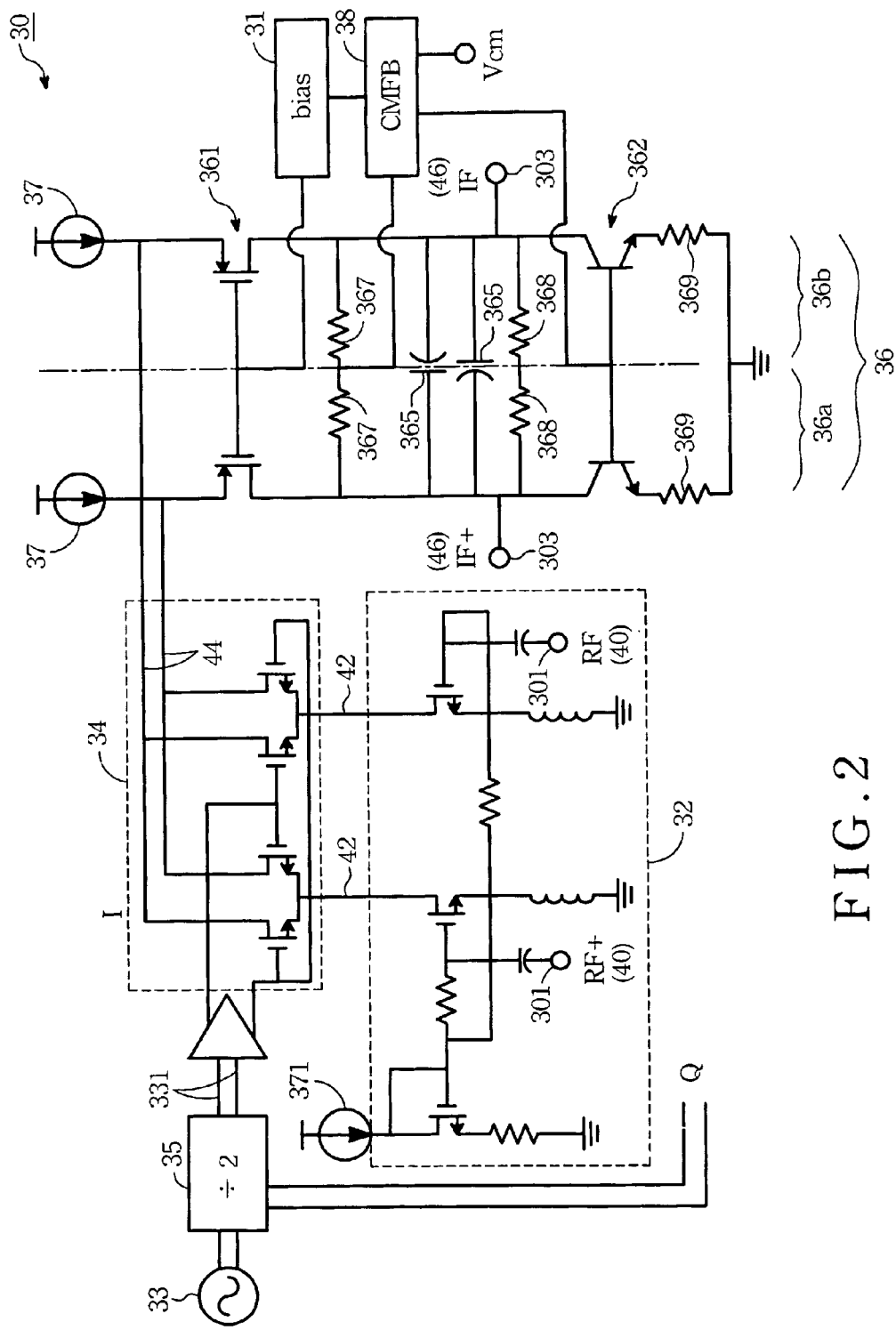
FIG. 2 is a circuit diagram according to one of the present embodiments.

Please refer to FIG. 2. It is a circuit diagram according to one of the present embodiments. As mentioned above, the present mixer 30 comprises a gain stage 32, a switch stage 34 and a load stage 36. The gain stage 32 receives RF signal 40 of differential type and generates a first gained signal 42. Before the RF signal 40 is transferred to the gain stage 32, a pre-selection filter (shown as numeral 12 of FIG. 1) may be used to filter out out-of-band signals. A LNA (shown as numeral 14 of FIG. 1), which may couple with the mixer 30 at the input point 301, may be employed to amplify the filtered RF signal 32.

According to the differential RF signal 40, thus, the mixer 30 is designed as a balanced circuit. As shown in FIG. 2, the gain stage 32, the switch stage 34 and the load stage 36 are separately a balanced circuit. The load stage 36 comprises a balanced first portion 36a and second portion 36b.

The switch stage 34 is used for mixing the first gained signal 42 and a local oscillation (LO) signal 331 to direct down-convert into a modulated signal 44. The LO signal 331 is provided by a local oscillator 33. The frequency of the LO signal 331 is near the frequency of the RF signal 40, or the first gained signal 42. Because the frequency of the first gained signal 42 and LO signal 331 are close to each other, the frequency of the modulated signal 44, which is equal to the difference between the first gained signal 42 and LO signal 331, is near to the DC frequency. In practice, the balanced status of the switch stage 34 is very important, in case distortion to the differential signal occurs.

According to FIG. 1 and the described prior art, a homodyne RF receiver may comprise not only one mixer. The present mixer 30 is able to be applied in both the I channel or the Q channel. Therefore, the local oscillator 33 is coupled with a frequency divider 35 to generate the phase difference.

Please continue with FIG. 2, the load stage 36 comprises a pair of first transistors 361, a pair of second transistors 362 and an impedance element (a pair of resistances 368 in this embodiment). The pair of first transistors 361 separately belong to the first portion 36a or the second portion 36b. The pair of the second transistor 362 separately belong to the first portion 36a or the second portion 36b. In this embodiment, a pair of resistances 368 are implemented for the impedance element. The resistances 368 belong to one of the first portion 36a or the second portion 36b respectively. However, in other embodiments a pair of capacitances is used to replace the pair of resistances 368 as the impedance element. In another embodiments, the impedance element is able to be the combination of resistance pair and capacitance pair.

Because of the parallel property of the balanced circuit, please only refer to one of the first portion 36a or the second portion 36b. The first transistor 361 provides a low impedance, corresponding to the high impedance of the first current source 37. Hence, the modulated signal 44 tends to enter the load stage 36. The second transistor provides a high impedance to resist signals. In practice, the second transistor 362 is coupled with a second resistance 367 to provide high impedance. Therefore, the signal is lead to the output point 303 through the impedance element, which may be implemented by one resistance 368 and one capacitance 365. The impedance element has a first gain coefficient. As a result, the load stage 36 converts the modulated signal 44 to a second gained signal 46 according to the first gain coefficient (of the resistance 368 and the capacitance 365). The second gained signal 46 will be further processed by the following circuit of the homodyne RF receiver.

In practice, the first current source 37 provides needed current for the switch stage 34 and the load stage 36. The current flows to the first transistor 361 will be the difference between the first current source 37 and the second current source 371, the second current source 371 being coupled with the gain stage 32.

Figure 4:
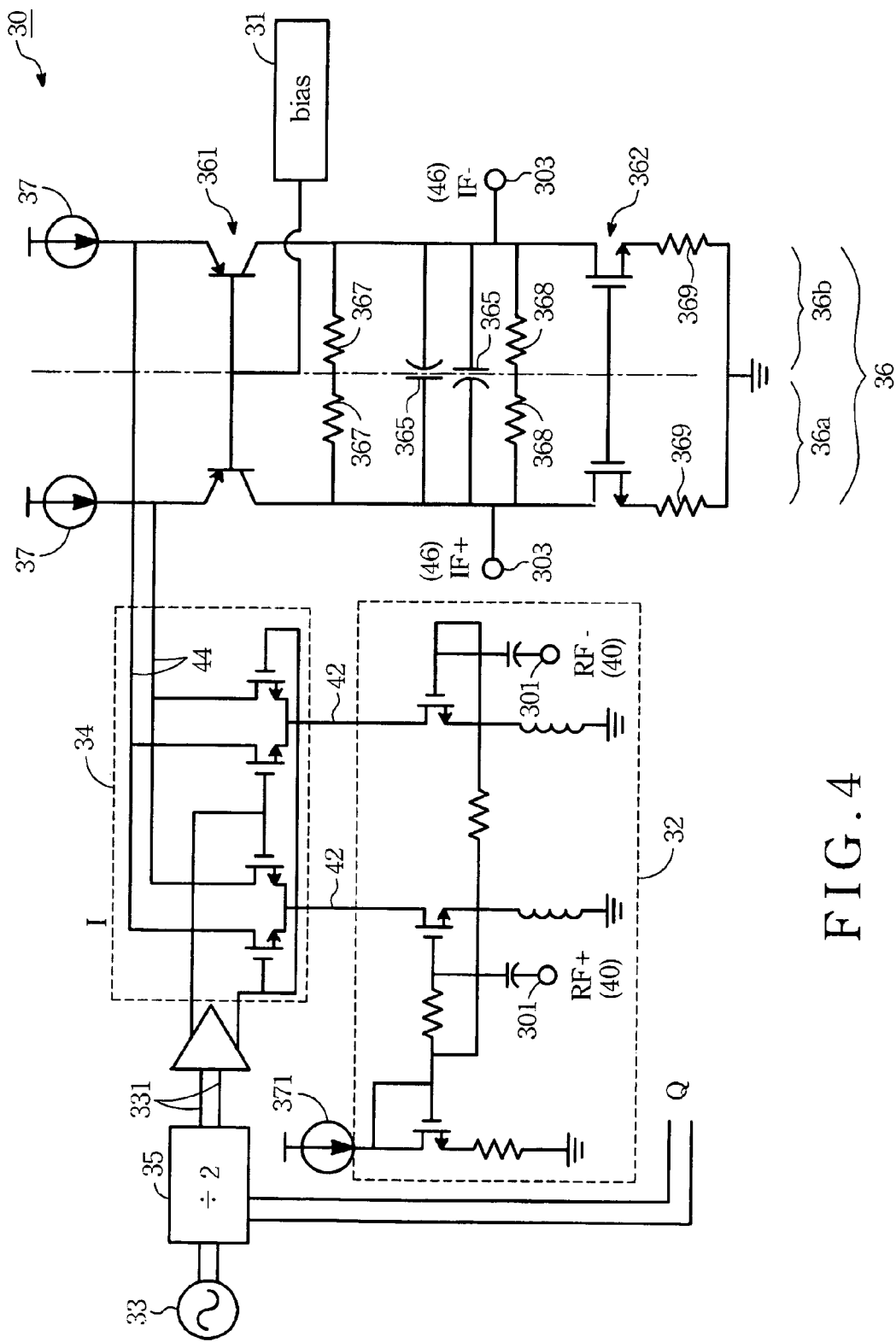
FIG. 4 is a circuit diagram according to another present embodiments.

For balancing the first portion 36a and the second portion 36b, the pair of the first transistors 361 have gate terminals which are connected to a common node, in other words, common gate. The contact of the common gate of the first transistors 361 is coupled with a bias 31. The pair of the second transistors 362 have common gate. The contact of the common gate of the pair of the second transistors 362 is coupled with a CMFB (common feedback) 38 for detecting unbalance of signals and for feedback. Or in another embodiment, the pair of the second transistor 362 form a current mirror, as shown in FIG. 4. These embodiments can efficiently eliminate the drawback of DC offset.

Figure 3:
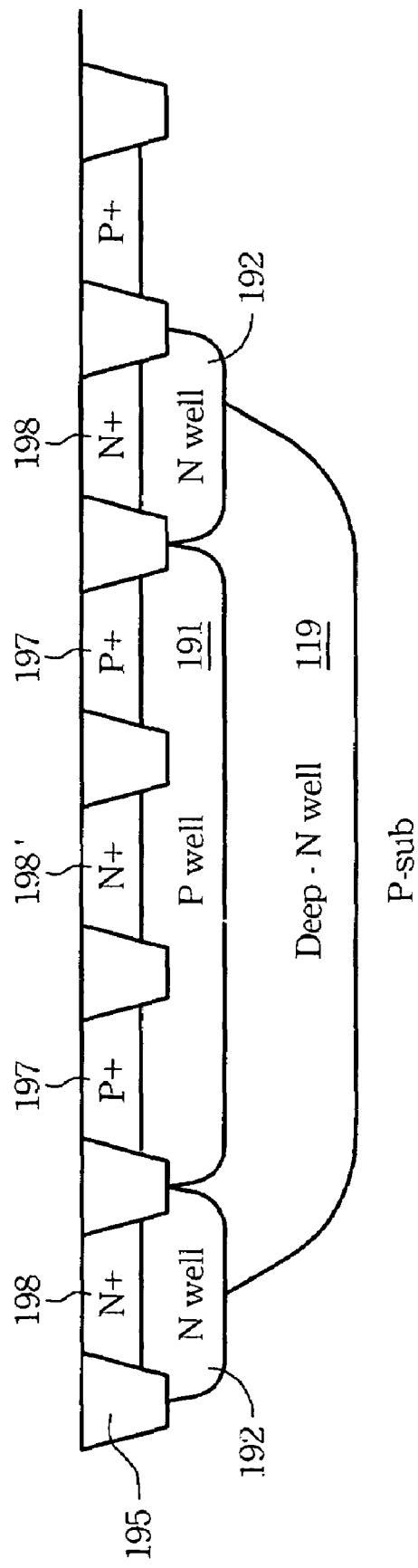
FIG. 3 shows a cross section view of the vertical npn BJT.

In the embodiment according to FIG. 2, the second transistor 362 is a vertical npn bipolar junction transistor (BJT), which is parasitically formed on a MOS structure. FIG. 3 shows a cross section view of the vertical npn BJT.

Considering to that there is no npn in conventional digital CMOS process. The exemplary embodiment of the present invention adds a deep N-well mask in a conventional n-MOS module to form the needed vertical npn BJT. The original source or drain N+ doped area: (198') forms a emitter region. P-well 191 from the n-MOS module forms a base region. The added deep N-well 119 forms a collector region. N-well 192 from p-MOS module and N+ doped area (198) form sinker implant to reduce resistance of the collector (the deep N-well 119). P+ doped area (197) can reduce resistance of the base (P-well 191). Thus, a vertical npn BJT is here provided by parasitically formation on a MOS structure.

Through the present vertical npn BJT for the second transistor 362, the noise to signal ratio of homodyne RF receiver can be efficiently suppressed. Even though the $f_T$ of this vertical npn BJT can only achieve 2 GHz, which is not good enough for typical BJT. However, it is good enough for analog operation, which requires a $f_T$ smaller than 50 Hz. Especially comparing with the n-MOS, the vertical npn BJT has a 1/f noise; which is 100 times less than the n-MOS. Obviously, the present invention has remarkable contribution in the noise issue of the homodyne RF receiver.

Please refer to FIG. 4. It is a circuit diagram according to another present embodiments. It has been found that IIP3 can be degraded due to the cascode p-MOS, as the first transistor 361, in the folding load stage 36. Hence, the present invention replaces the traditional p-MOS to a lateral pnp BJT. Higher gm from the lateral pnp BJT provides cleaner spectrum of the second gained signal 46 at the differential output point 303.

Considering there is no high performance pnp in conventional CMOS process, and also considering to the poor performance of a vertical pnp BJT, which is parasitically formed on a MOS structure like the embodiment shown as FIG. 3, the mentioned lateral pnp BJT is employed for the first transistor 361 in the present invention. The vertical pnp BJT (not shown) has poor performance due to there is no isolated collector terminal existing in the parasitic structure, and also because of the much lower β value (only about 2.5).

Figure 5A:
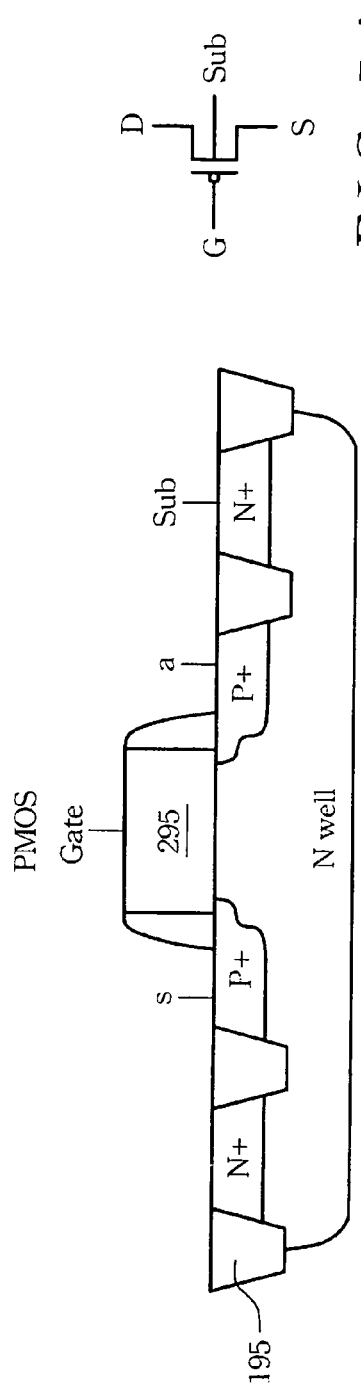
FIG. 5A shows a cross section view of a p-MOS module.
Figure 5B:
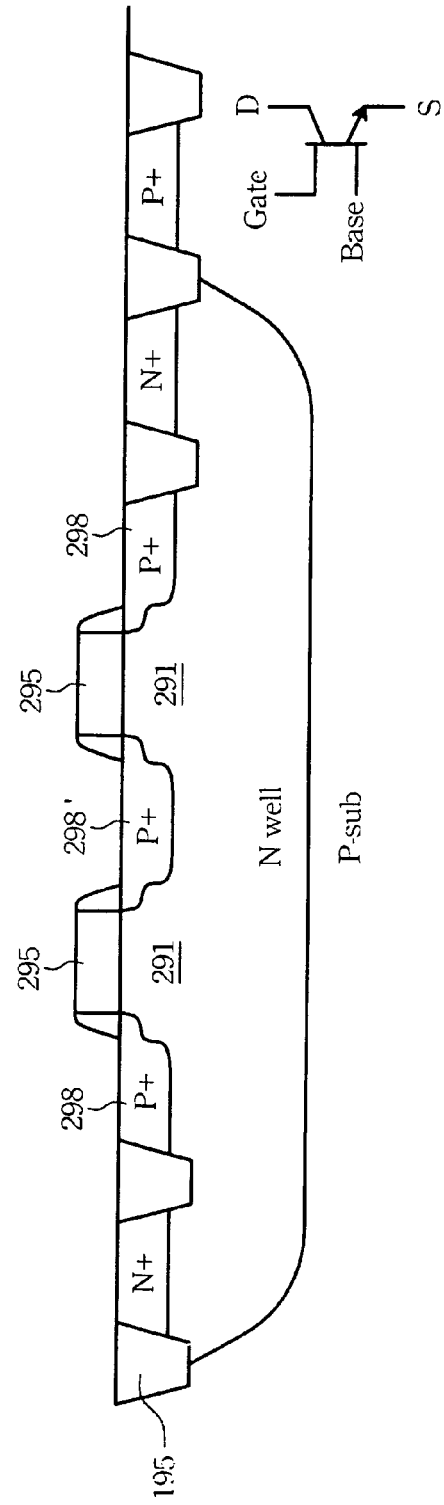
FIG. 5B shows a cross section view of the parasitic parallel pnp BJT.

Under these reasons, a parasitic pnp existing in p-MOS module is used. Please refer to FIG. 5A and FIG. 5B, FIG. 5A shows a cross section view of a p-MOS module; FIG. 5B shows a cross section view of the parasitic parallel pnp BJT. The p-MOS shown in FIG. 5A has to be turned off. In practice, turning off the p-MOS by setting the gate bias to VDD. As a result, the source or drain terminals (P+ doped area) in the p-MOS module can be used as the emitter 298' or the collector 298. The N-well can be used as base contact.

From simulation, the IIP3 value can be degraded about 3~4 dBm from the mixer's gain stage 32 and switch stage 34 because of using a p-MOS as the first transistor 361. Using the lateral pnp BJT according to the described embodiment, the IIP3 can be maintained or even a little bit better. Depending on the cellular/wireless system's specification, less than 10 MHz operation is required from the load stage 36. The $f_T$ value (the measure of "cut-off frequency") of the lateral pnp BJT, which is parasitically formed from CMOS process, is only about 1 GHz or hundreds MHz. Obviously, in this aspect, the performance of the present invention have exceeded the requirement.

Figure 6:
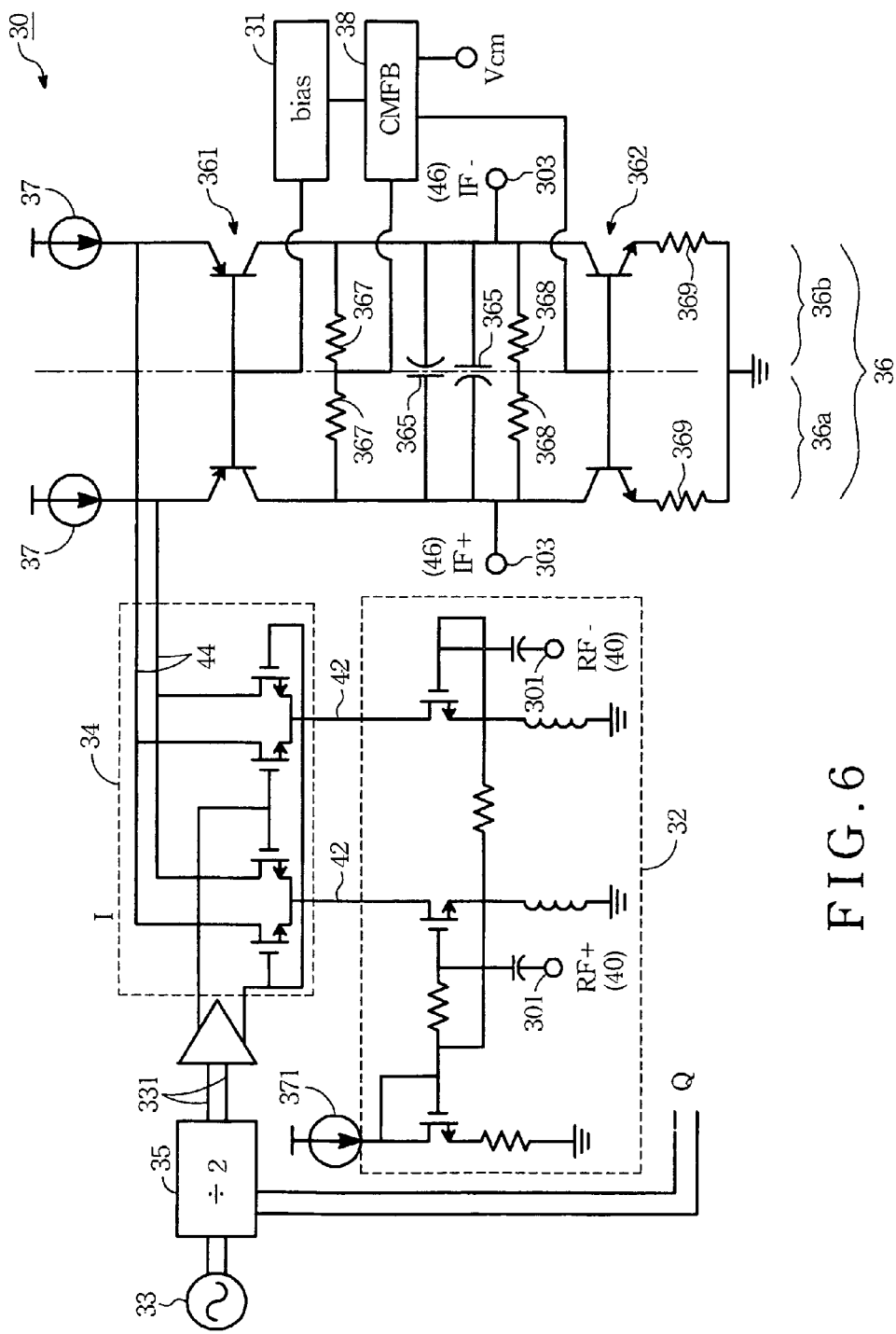
FIG. 6 is a circuit diagram according to another present embodiments.

Please refer to FIG. 6. It is a circuit diagram according to another present embodiments. This embodiment combines the advantages of the embodiments according to FIG. 2 and FIG. 4. The first transistor 361 is a lateral pnp BJT, which is parasitically formed on a p-MOS structure from CMOS process. The second transistor 362 is a vertical npn BJT, which is parasitically formed on a n-MOS structure from CMOS process. According to the foregoing embodiments, the present invention has provided a mixer for homodyne RF receiver having reduced noise to signal ratio. Besides, the present mixer also has improved IIP3 performance. The problem of DC offsets is well controlled by the present balanced circuit. Furthermore, the present invention utilizing CMOS process to provide a mixer for homodyne RF receiver, so the present invention can readily be utilized by using existed facilities and also meet the tendency of SoC.

With the example and explanations above, the features and spirits of the invention are hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A mixer of a homodyne radio frequency (RE) receiver, which is made from a CMOS process, comprising:
    a gain stage, receiving a differential-typed RF signal and generating a first gained signal;
    a switch stage, used for mixing said first gained signal and a local oscillation (LO) signal to direct down-convert into a modulated signal; and
    a load stage, comprising a pair of first transistors, an impedance element and a pair of second transistors, the pair of first transistors providing a low impedance to permit said modulated signal entering the load stage, the impedance element having a first gain coefficient, the pair of second transistors providing a high impedance to resist signals, the load stage converting the modulated signal to a second gained signal according to the first gain coefficient, wherein the second transistor is a vertical npn bipolar junction transistor (BJT), which is parasitically formed on a MOS structure.

2. The mixer according to claim 1, wherein the first transistor is a parallel pnp bipolar junction transistor (BJT), which is parasitically formed on a MOS structure.

3. The mixer according to claim 1, wherein the mixer is a balanced circuit, wherein the load stage comprises a balanced first portion and a second portion.

4. The mixer according to claim 3, wherein the pair of first transistors separately belongs to said first portion and said second portion, and the pair of second transistors separately belongs to said first portion and said second portion.

5. The mixer according to claim 4, wherein the pair of first transistors have gate terminals which are connected to a common node.

6. The mixer according to claim 4, wherein the pair of second transistors have gate terminals which are connected to a common node.

7. The mixer according to claim 6, wherein a contact of the common gate of the pair of said second transistors is coupled with a CMFB (common feedback) for detecting unbalance of signals and for feedback.

8. The mixer according to claim 4, wherein the pair of said second transistors form a current mirror.

9. The mixer according to claim 1, wherein the impedance element is selected from the group consisting of a capacitance or a first resistance.

10. The mixer according to claim 1, wherein the second transistors is coupled with a second resistance to provide said high impedance.

11. A mixer of a homodyne radio frequency (RF) receiver, which is made from a CMOS process, comprising:
    a gain stage, receiving a differential-typed RF signal and generating a first gained signal;
    a switch stage, used for mixing said first gained signal and a local oscillation (LO) signal to direct down-convert into a modulated signal; and
    a load stage, comprising a pair of first transistors, an impedance element and a pair of second transistors, the pair of first transistors providing a low impedance to permit said modulated signal entering the load stage, the impedance element having a first gain coefficient, the pair of second transistors providing a high impedance to resist signals, the load stage converting the modulated signal to a second gained signal according to the first gain coefficient, wherein the first transistor is a parallel pnp bipolar junction transistor (BJT), which is parasitically formed on a MOS structure.

* * * * *